(12) United States Patent
Costante et al.

(10) Patent No.: US 10,671,189 B2
(45) Date of Patent: *Jun. 2, 2020

(54) TRACKPAD WITH CAPACITIVE FORCE SENSING AND HAPTIC FEEDBACK

(71) Applicant: GOOGLE LLC, Mountain View, CA (US)

(72) Inventors: Diego Rivas Costante, San Francisco, CA (US); Samuel Vinci, San Francisco, CA (US); Emily Porter, Berkeley, CA (US); Steven Jacobs, San Francisco, CA (US); Guangqun Chen, San Francisco, CA (US); Maggie Mittan, Piedmont, CA (US); Andrew Ness, Oakland, CA (US); Debanjan Mukherjee, San Jose, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/562,935

(22) Filed: Sep. 6, 2019

(65) Prior Publication Data

US 2019/0391677 A1    Dec. 26, 2019

Related U.S. Application Data

(63) Continuation of application No. 15/996,065, filed on Jun. 1, 2018.

(51) Int. Cl.
*G06F 3/0354*   (2013.01)
*G06F 1/16*   (2006.01)
(Continued)

(52) U.S. Cl.
CPC ........ *G06F 3/03547* (2013.01); *G06F 1/1613* (2013.01); *G06F 3/016* (2013.01);
(Continued)

(58) Field of Classification Search
CPC ...... G06F 3/016; G06F 3/0414; G06F 3/0416; G06F 3/044; G06F 3/04812;
(Continued)

(56) References Cited

U.S. PATENT DOCUMENTS 5,854,625 A   12/1998 Frisch et al.
7,602,384 B2  10/2009 Rosenberg et al.
(Continued)

FOREIGN PATENT DOCUMENTS

TW   201439868 A   10/2014
TW   201716967 A   5/2017

OTHER PUBLICATIONS

Office Action for Taiwanese Application No. 108118881 (with English Translation), dated Mar. 25, 2020, 17 pages.

*Primary Examiner* — Nelson M Rosario
(74) *Attorney, Agent, or Firm* — Brake Hughes Bellermann LLP

(57) ABSTRACT

A trackpad includes: a substrate; a circuit board coupled to the substrate for detecting a position of an object adjacent the substrate; a haptic feedback component coupled to the circuit board; a first plate coupled to the circuit board; a second plate including a spring element, a spacer coupling the circuit board and the spring element to each other, the spring element facilitating first movement of the substrate, the circuit board and the first plate relative to the second plate, the spacer facilitating second movement of at least the substrate and the circuit board by the haptic feedback component; and a capacitive force sensor that detects a capacitance of the first plate and the second plate. A trackpad can include a circuit board coupled to the substrate and including the first plate.

20 Claims, 13 Drawing Sheets

(51) Int. Cl.
*G06F 3/01* (2006.01)
*G06F 3/041* (2006.01)
*G06F 3/044* (2006.01)
*H05K 1/18* (2006.01)
*H05K 7/14* (2006.01)

(52) U.S. Cl.
CPC ............ *G06F 3/044* (2013.01); *G06F 3/0414* (2013.01); *H05K 1/181* (2013.01); *H05K 7/142* (2013.01); *G06F 2203/0338* (2013.01)

(58) Field of Classification Search
CPC .. G06F 3/04847; G06F 3/0486; G06F 3/0488; G06F 2203/04808
See application file for complete search history.

(56) References Cited

U.S. PATENT DOCUMENTS

| | | |
|---|---|---|
| 8,633,916 B2 | 1/2014 | Bernstein et al. |
| 9,250,754 B2 | 2/2016 | Tenuta et al. |
| 2006/0109256 A1* | 5/2006 | Grant ..................... G06F 3/016 345/173 |
| 2013/0328820 A1 | 12/2013 | Kondoh et al. |
| 2014/0176462 A1 | 6/2014 | Ponziani |
| 2015/0116205 A1 | 4/2015 | Westerman et al. |
| 2017/0075424 A1 | 3/2017 | Bernstein et al. |
| 2017/0285848 A1 | 10/2017 | Rosenberg et al. |

* cited by examiner

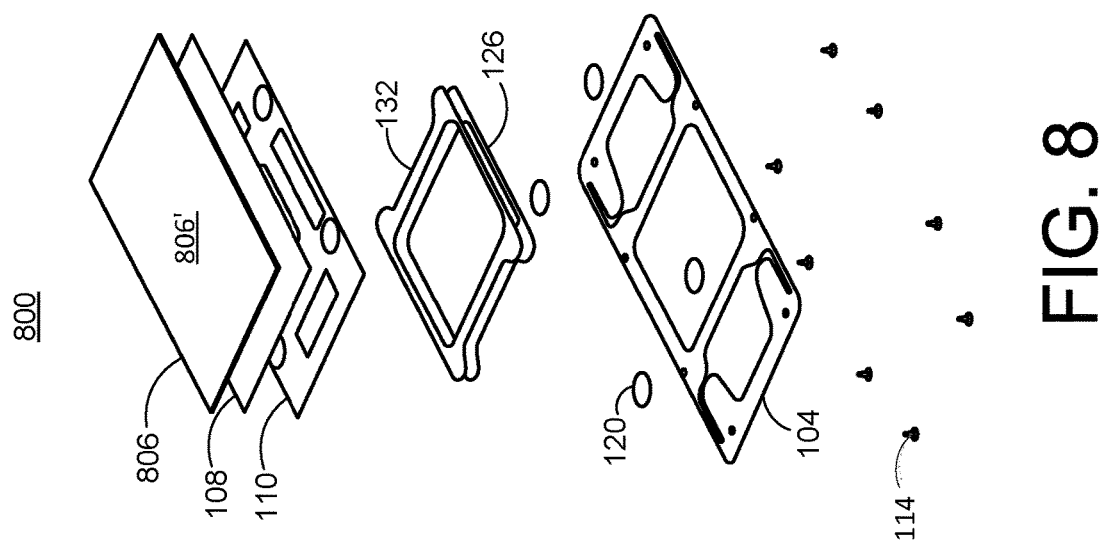
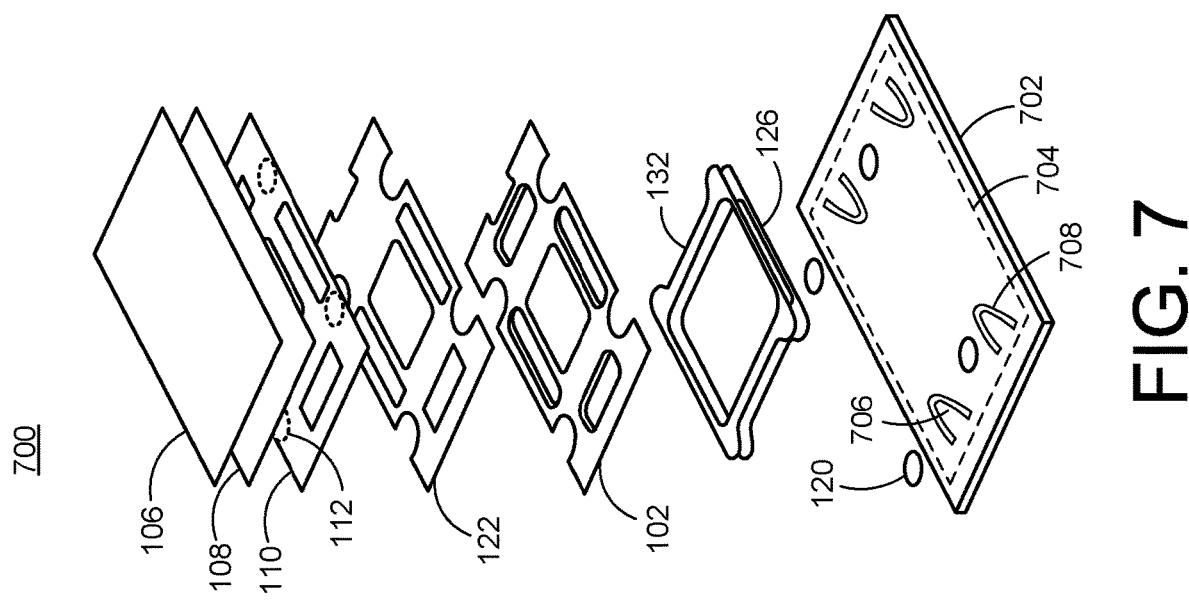

US 10,671,189 B2

TRACKPAD WITH CAPACITIVE FORCE SENSING AND HAPTIC FEEDBACK

CROSS-REFERENCE TO RELATED APPLICATION

This application is a continuation of, and claims priority to, U.S. application Ser. No. 15/996,065, filed on Jun. 1, 2018, entitled "TRACKPAD WITH CAPACITIVE FORCE SENSING AND HAPTIC FEEDBACK", the disclosure of which is incorporated by reference herein in its entirety.

TECHNICAL FIELD

This document relates, generally, to a trackpad with capacitive force sensing and haptic feedback.

BACKGROUND

Some devices use a trackpad or touchpad to register input from a user to the system. Input can be registered as position information to guide the user in pointing to objects or locations on an accompanying screen. Input can be registered as a force or displacement, to allow the user to click on a displayed object. Some existing trackpads are designed with a hinged surface that pivots along one of its edges, to allow the user to input taps or clicks. Such actuation can therefore be constrained to pressing primarily on a particular section of the pad. Some trackpads can provide tactile feedback, sometimes referred to as haptic feedback.

SUMMARY

In a first aspect, a trackpad includes: a substrate; a circuit board coupled to the substrate for detecting a position of an object adjacent the substrate; a haptic feedback component coupled to the circuit board; a first plate coupled to the circuit board; a second plate including a spring element, a spacer coupling the circuit board and the spring element to each other, the spring element facilitating first movement of the substrate, the circuit board and the first plate relative to the second plate, the spacer facilitating second movement of at least the substrate and the circuit board by the haptic feedback component; and a capacitive force sensor that detects a capacitance of the first plate and the second plate.

Implementations can include any or all of the following features. The first movement occurs in a first direction, and the second movement occurs in a second direction essentially perpendicular to the first direction. The spring element and the spacer provide decoupling of the haptic feedback component and the capacitive force sensor from each other. The haptic feedback component comprises a layer abutting the substrate. The haptic feedback component is divided between the circuit board and the second plate. A coil of the haptic feedback component is mounted to one of the circuit board and the second plate, and a magnet of the haptic feedback component is mounted to another of the circuit board and the second plate, the haptic feedback component providing haptic feedback through the substrate using the coil and the magnet. The trackpad includes multiple haptic feedback components coupled to the substrate to provide localized haptic feedback. The spring element includes a finger element in the second plate. The second plate is integral with a housing accommodating the trackpad. The spring element is formed by a cutout in the housing that defines a finger element. The first plate is coupled to the circuit board by being mounted to the circuitry board. The first plate includes a pad on a surface of the circuit board that faces the second plate. The capacitive force sensor is to detect a change in the capacitance and provide a force signal based on the detected change in capacitance. The trackpad further includes a dielectric between the first plate and the second plate. The dielectric is sized to facilitate the first movement of the substrate and the circuit board relative to the second plate without damage to the circuit board. The spacer includes a stiffener plate for the circuit board and the substrate. The trackpad further includes a dielectric attached to the stiffener plate. The stiffener plate is attached to the circuit board, and wherein the spacer further includes a foam disc between the stiffener plate and the spring element. The foam disc comprises a silicone foam disc.

In a second aspect, a method includes: detecting a position of an object adjacent a substrate of a trackpad, the position detected using a circuit board coupled to the substrate, the trackpad including a first plate; performing a first operation based on detecting the position; detecting a force applied to the substrate using a capacitive force sensor that detects a capacitance of the first plate and a second plate of the trackpad, the second plate including a spring element that facilitates movement of the substrate and the circuit board relative to the second plate; performing a second operation based on detecting the force; and providing haptic feedback to the substrate using a haptic feedback component coupled to the circuit board, the haptic feedback component and the capacitive force sensor decoupled from each other.

BRIEF DESCRIPTION OF DRAWINGS

FIG. 7 shows an example of a trackpad architecture.

FIG. 8 shows an example of a trackpad architecture.

Like reference symbols in the various drawings indicate like elements.

DETAILED DESCRIPTION

This document describes examples of input devices, such as trackpads or touchpads, that have improved architectures for performing position detection, force detection and/or providing haptic feedback to the user. In some implementations, force detection (e.g., to recognize that a user "clicks" using a finger or stylus) can be performed based on a capacitive detection between a plate and a part of a circuit board used in the position detection. In some implementations, a decoupling can be provided between a component that provides capacitive force sensing and a component that provides haptic feedback.

A trackpad or touchpad are mentioned herein as examples and can be considered synonymous. Either or both of these can feature a surface formed by a substrate (e.g., glass, metal and/or a synthetic material such as a polymer) intended to be touched by the user in order to make one or more inputs into a system. For example, the user can place one or more fingers and/or one or more other objects (e.g., a stylus) on the surface of the substrate to generate such input(s). In some implementations, more complex inputs can be recognized, including, but not limited to, gestures, sequences and/or patterns.

Position detection can be performed using any suitable technology. In some implementations, capacitive sensing is used. For example, the presence of a fingertip and/or a capacitive stylus at or near the surface of the substrate can change the electrical capacitance of that portion of the substrate, and therefore be registered as an input. As such, while examples herein mention the user touching a substrate in order to make input, it may be sufficient to place an object sufficiently close to, without actually touching, the substrate. In some implementations, resistive sensing is used. For example, the presence of an object can alter the resistance of electrodes in or on the substrate, thereby facilitating recognition of the input.

An input device such as a trackpad can be used solely to allow the user to make input, or it can simultaneously or at other times perform one or more other functions as well. In some implementations, the trackpad can provide haptic feedback to the user. For example, this can be done by displacing the substrate (e.g., in a vibration-like fashion) in a way that can be tactilely perceived by the user. In some implementations, the trackpad can also feature a display mechanism configured to output visual information to the user, in analogy to how a touchscreen operates. For example, and without limitation, trackpad technology described herein can be implemented as part of a touchscreen such that a display can present information to the user and the trackpad (which can occupy the same area as the display) can register user inputs (e.g., taps, selections and/or dragging of objects).

Figure 1:
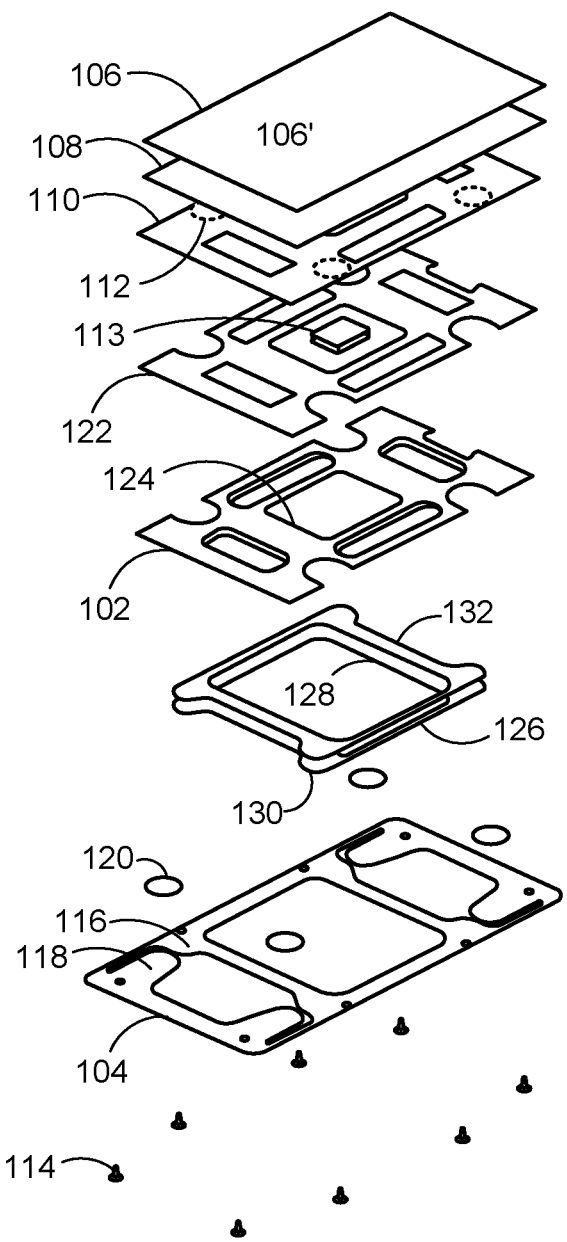
FIG. 1 shows an exploded view of an example of a trackpad architecture having a stiffener plate and a target plate.

FIG. 1 shows an exploded view of an example of a trackpad architecture 100 having a stiffener plate 102 and a target plate 104. The exploded view illustrates exemplary components somewhat separated from each other for purposes of clarity, with such components being assembled into a functioning assembly in an operative implementation. The trackpad architecture 100 can be used in any or all examples described herein. For example, the trackpad architecture 100 can be implemented in one or more devices exemplified below with reference to FIG. 15. For example, and without limitation, a mobile device, a smartphone, a tablet, a laptop, a personal computer, an appliance, a television, a vehicle, and/or another user electronic device can have the trackpad architecture 100.

The trackpad architecture 100 includes a substrate 106 with a surface 106' that can be intended to be facing toward a user. For example, the surface 106' can be accessible to the user, such as by way of the user's finger(s) and/or a stylus or other object. In some implementations, the substrate 106 can include glass. For example, soda lime glass can be used. The substrate 106 may be treated in one or more ways. For example, the surface 106' can be sandblasted. The substrate 106 can be transparent, partially transparent, partially opaque, or opaque. In some implementations, the surface opposite the surface 106' can be treated in one or more ways. For example, a material (e.g., ink and/or epoxy) can be applied (e.g., by a printing process, such as by silkscreen printing).

The trackpad architecture 100 can include an adhesive layer 108 that contacts the substrate 106. For example, the adhesive layer 108 can be applied to some or all of the surface that is opposite the surface 106' of the substrate 106. Any suitable type of adhesive can be used. For example, the adhesive layer 108 can include a pressure-sensitive adhesive.

The trackpad architecture 100 can include a circuit board 110 for detecting a position of an object adjacent the substrate 106. In some implementations, the circuit board 110 includes electrical or electronic components, and connections between them, for sensing the contact or the proximate presence of an object such as the user's finger(s) and/or a stylus, and to generate a corresponding position signal. Such a position signal can be used for one or more purposes by a system. The position signal can cause one or more actions to be performed, and/or one or more actions to be inhibited, in the system. For example, and without limitation, the position signal can select an object, move an object, generate a sound, and/or switch a device into a different state (e.g., on or off). In some implementations, the circuit board 110 can include a printed circuit board assembly (PCBA).

The trackpad architecture 100 can include a haptic feedback component 113 configured to provide haptic feedback (e.g., a perceptible tactile sensation) to the user via the substrate 106. In some implementations, the haptic feedback component 113 is coupled to the circuit board 110. For example, the haptic feedback component 113 can be mounted to the circuit board 110 on the surface opposite the surface 106'. In some implementations, the haptic feedback component 113 can include an electromagnetic actuator. For example, a linear resonant actuator can be used.

The trackpad architecture 100 can include one or more plates mounted to the circuit board for use in capacitive force sensing. In some implementations, the circuit board 110 can include one or more (e.g., four) pads 112 capable of exhibiting capacitance. For example, the pad(s) 112 can be mounted to a surface of the circuit board 110 that faces the stiffener plate 102 and/or the target plate 104.

The stiffener plate 102 can serve to provide structural integrity to the circuit board 110 and/or to the substrate 106. For example, the stiffness can counteract any force that is applied as part of a user touching or pressing on the substrate 106. As such, in an implementation that includes the stiffener plate 102, the circuit board 110 and/or the substrate 106 need not be made as stiff as they otherwise might have been.

The target plate 104 can serve as another electrode in capacitive sensing that involves the pad(s) 112. In some implementations, the capacitance of the pad(s) 112 and the target plate 104, and/or a change in such capacitance, can be detected or determined. For example, a change in capacitance caused by dislocation of the pad(s) 112 as the user presses on the substrate 106, can be interpreted as a force on the trackpad and accordingly trigger a force signal in the system. As such, the trackpad architecture 100 can include a capacitive force sensor that can detect inputs such as the user clicking, or pressing, on the substrate 106.

The target plate 104 can be made of metal. In some implementations, the target plate 104 includes steel. For example, stainless steel can be used. The target plate 104 can be stamped from material stock (e.g., a sheet of metal). The target plate 104 can be attached to another component (not shown). In some implementations, screws 114 or other fasteners can be used. For example, the screws 114 can secure the target plate 104 to a housing of an electronic device (e.g., a laptop or other computer device). The target plate 104 can have one or more areas 116 that essentially align with the pad(s) 112 in assembly. For example, the area 116 can have approximately the same shape as the pad 112 (e.g., circular).

The target plate 104 can include one or more spring elements 118 that will allow dislocation of some components of the trackpad architecture 100 relative to others. The spring element 118 can include a portion of the target plate 104 having a shape (e.g., a longitudinal shape attached only at one end or at one side) that allows it to flex when force is applied. For example, the spring element 118 can include a spring finger having approximately a u-shape which is attached at its top and is able to flex toward its bottom.

The trackpad architecture 100 can include one or more discs 120 positioned between the target plate 104 and another component of the trackpad architecture 100. Here, the disc(s) 120 can be positioned between the stiffener plate 102 and the target plate 104. The stiffener plate 102, in turn, can be attached to the circuit board 110 using an adhesive 122. For example, a pressure-sensitive adhesive can be used. As such, the stiffener plate 102 can abut the disc(s) 120, and the disc(s) 120 can abut the target plate 104. If force is applied to the substrate 106 in a direction toward the stiffener plate 102, the substrate 106, the circuit board 110, the stiffener plate 102 and the disc(s) 120 can be dislocated toward the target plate 104. This dislocation can be facilitated by the flexing of the spring elements 118. For example, a recess behind the spring element 118 in the housing of the device can allow such flexing.

The disc 120 can facilitate movement of the circuit board 110 and the substrate 106 caused by the haptic feedback component 113. The disc 120 can include a material that allows the disc 120 to flex or shear in a direction that allows such movement. In some implementations, the disc 120 can include a foam material. For example, a silicone foam material can be used.

The stiffener plate 102 can be made of metal. In some implementations, the stiffener plate 102 includes steel. For example, stainless steel can be used. The target plate 104 can be stamped from material stock (e.g., a sheet of metal). The stiffener plate 102 can have one or more openings. In some implementations, an opening 124 can be provided in the stiffener plate. For example, the opening 124 can accommodate the haptic feedback component 113 (e.g., as mounted to the circuit board 110).

It was exemplified above that the trackpad architecture 100 can feature capacitive force sensing. In some implementations, an absolute (as opposed to relative) capacitance between the pad 112 and the target plate 104 can be detected or determined. For example, the change in absolute capacitance can be detected.

One or more dielectrics can be provided. In some implementations, a dielectric 126 can be provided between the pad 112 and the target plate 104. The dielectric 126 can include a polymer material, including, but not limited to, a polyethylene terephthalate material. For example, the dielectric 126 can include a MYLAR film. The dielectric 126 can have any suitable shape, thickness, size, aspect ratio and/or configuration. Here, the dielectric 126 has an opening 128 and respective portions 130. In some implementations, the portion 130 can be configured correspondingly to the disc 120. For example, the portion 130 can have a rounded shape when the disc 120 is round or has a rounded shape. In some implementations, the dielectric 126 can be mounted to another component in the trackpad architecture 100. Here, the dielectric 126 is to be mounted to the stiffener plate 102. For example, an adhesive 132 can be used, including, but not limited to, a pressure-sensitive adhesive.

The dielectric 126 can serve to limit the displacement of particularly the circuit board 110. For example, components or circuitry on the circuit board 110 could be damaged if the circuit board were brought into contact with the target plate 104 as a result of the displacement. As such, the dielectric 126 can allow the circuit board 110 to undergo a certain displacement, and then the stiffener plate 102 (or another component being displaced) can bottom out against the dielectric 126 to prevent that the circuit board 110 comes into contact with the target plate 104. As such, the dielectric 126 is an example of a material that can be sized to facilitate a movement of the substrate 106 and the circuit board 110 relative to the target plate 104 without damage to the circuit board 110.

As such, the trackpad architecture 100 is an example of an architecture for a trackpad that includes a substrate (e.g., the substrate 106) and a circuit board (e.g., the circuit board 110) coupled to the substrate for detecting a position of an object adjacent the substrate. The circuit board includes a first plate (e.g., the pad 112). The trackpad also includes a second plate (e.g., the target plate 104) including a spring element (e.g., the spring element 118). A spacer (e.g., the adhesive 122, the stiffener plate 102, and the disc 120) couples the circuit board and the spring element to each other. The spring element facilitating first movement of the substrate and the circuit board relative to the second plate (e.g., as described above regarding capacitive force sensing). The trackpad includes a capacitive force sensor (not fully shown in this illustration) that detects a capacitance of the first plate and the second plate (e.g., circuitry or other component connected to the pad 112 and to the target plate 104).

It was mentioned above that the disc 120 can facilitate movement of at least the substrate 106 due to operation of the haptic feedback component 113. In some implementations, the haptic feedback component 113 can be decoupled from the capacitive force sensor that detects capacitance in the trackpad architecture 100 (e.g., between the pad 112 and the target plate 104). In some implementations, the movement facilitated by the disc 120 and the movement facilitated by the spring element 118 can be essentially perpendicular to each other. For example, a divergence of travel directions up to about a few degrees (including, but not limited to, five degrees) from orthogonality can be considered essentially perpendicular.

As such, the trackpad architecture 100 is an example of an architecture for a trackpad that includes a substrate (e.g., the substrate 106) and a circuit board (e.g., the circuit board 110) coupled to the substrate for detecting a position of an object adjacent the substrate. The trackpad includes a haptic feedback component (e.g., the haptic feedback component 113) coupled to the circuit board. The trackpad includes a first plate (e.g., the pad 112) coupled to the circuit board. The trackpad includes a second plate (e.g., the target plate 104) including a spring element (e.g., the spring element 118). The trackpad includes a spacer (e.g., the adhesive 122, the stiffener plate 102, and the disc 120) coupling the circuit board and the spring element to each other. The spring element facilitates first movement (e.g., toward the target plate 104) of the substrate, the circuit board and the first plate relative to the second plate. The spacer facilitates second movement (e.g., parallel to the surface 106') of at least the substrate and the circuit board by the haptic feedback component.

Figure 2:
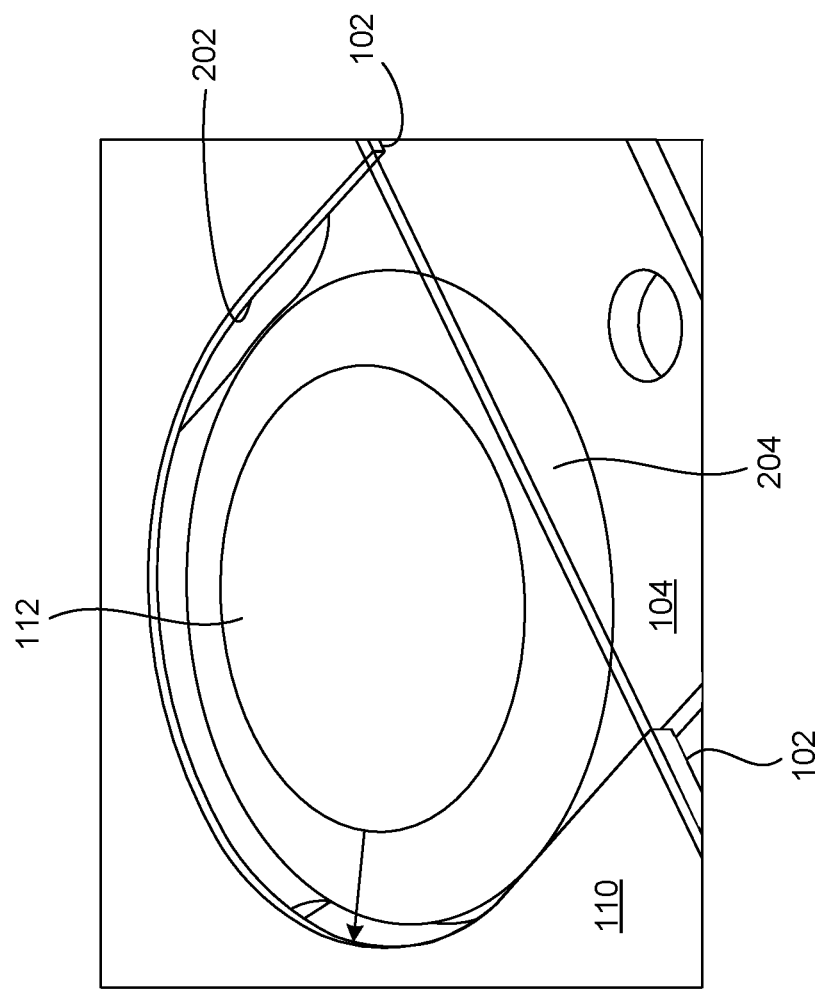
FIG. 2 shows an example of a capacitive target.
Figure 3:
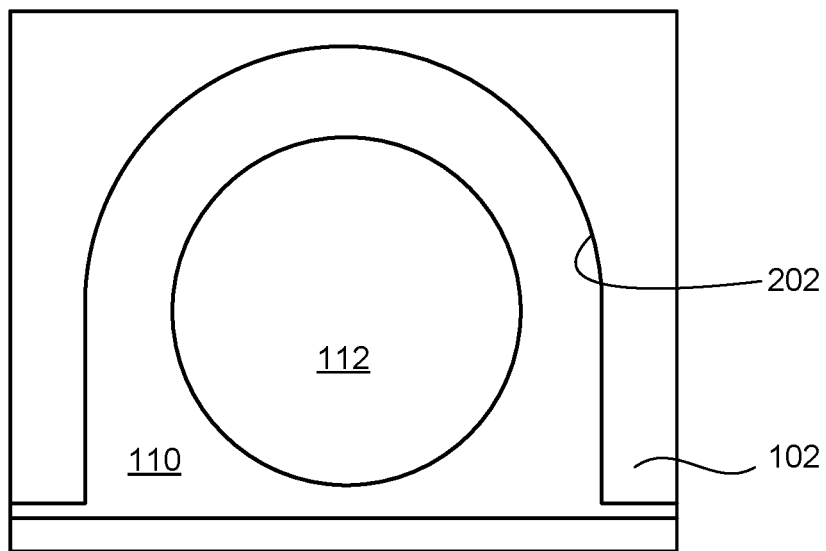
FIG. 3 shows an example of the capacitive target of FIG. 2.
Figure 4:
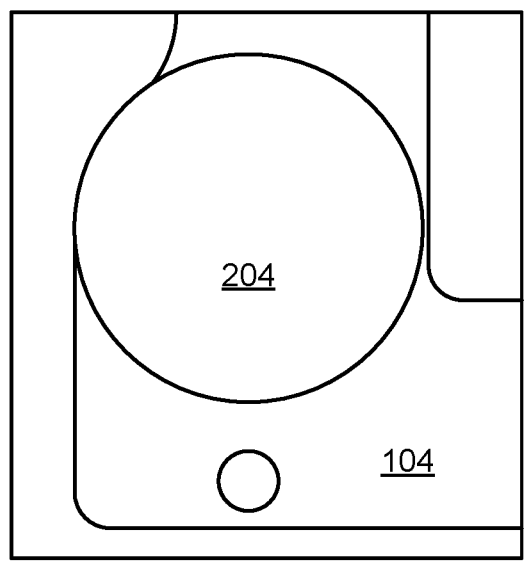
FIG. 4 shows another example of the capacitive target of FIG. 2.

FIG. 2 shows an example of a capacitive target 200. FIG. 3 shows an example of the capacitive target 200 of FIG. 2. FIG. 4 shows another example of the capacitive target 200 of FIG. 2. The capacitive target 200 can be implemented in any trackpad described herein, including, but not limited to, a trackpad using the trackpad architecture 100 in FIG. 1. Some aspects of the trackpad architecture 100 will be used for exemplification. The capacitive target 200 can include the circuit board 110 (e.g., a PCBA) which is here shown transparent to avoid visually obstructing other components. The stiffener plate 102 is here mounted to the circuit board 110. A recess 202 is formed in the stiffener plate 102.

The pad 112 is mounted to the circuit board 110. Here, the pad 112 is mounted on a surface of the circuit board 110 that is currently facing away, and the pad 112 is visible due to the transparency of the circuit board 110 in the illustration. In some implementations, the pad 112 can be formed as part of the process by which other components or circuitry is formed on the circuit board 110. For example, in a PCBA the pad 112 can be formed using an additive, subtractive or a semi-additive process.

A dielectric spacer 204 can be provided. In some implementations, a material identical or similar to that of the dielectric 126 (FIG. 1) can be used. For example, a MYLAR material can be used. The dielectric spacer 204 can be mounted to the target plate 104. The dielectric spacer 204 can be approximately the same size as the pad 112. For example, the dielectric spacer 204 can have a size approximately 40% larger than that of the pad 112. In some implementations, the dielectric spacer 204 can be centered on the pad 112.

Figure 5:
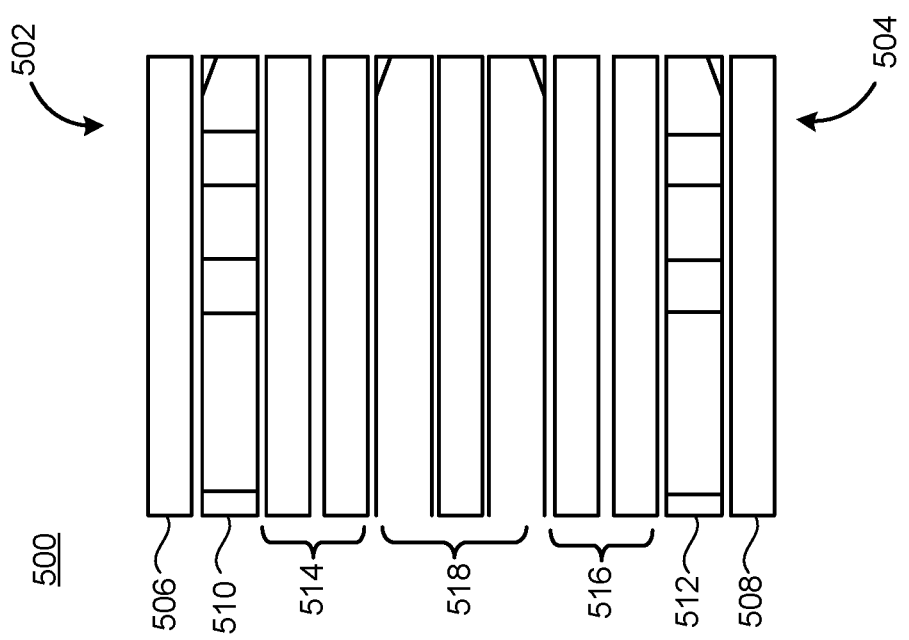
FIG. 5 shows an example of a printed circuit board assembly (PCBA).

FIG. 5 shows an example of a PCBA 500. The PCBA 500 can be used in one or more of the trackpads described herein. For example, the PCBA can serve as, or be included in, the circuit board 110 (FIG. 1). The PCBA 500 has a top 502 and a bottom 504. The terms "top" and "bottom" are referring only to the orientation of the PCBA 500 in this illustration, and do not necessarily reflect the orientation of the PCBA 500 in an implementation or during use.

The PCBA 500 can include one or more solder mask layer 506, 508. In some implementations, the solder mask layer 506, 508 can include polymer (e.g., a lacquer-like material) to protect the PCBA 500. Each of the solder mask layers 506, 508 can be approximately 5% of the thickness of the PCBA 500 (e.g., of the distance from the top 502 to the bottom 504).

The PCBA 500 can include one or more signal/foil layer 510, 512. In some implementations, the signal/foil layer 510, 512 can include a conductive material (e.g., copper) to facilitate signals or other electric transmissions in the PCBA 500. Each of the signal/foil layer 510, 512 can be approximately 10% of the thickness of the PCBA 500.

The PCBA 500 can include one or more pre-preg layer 514, 516. In some implementations, the pre-preg layer 514, 516 can include a polymer material (e.g., epoxy) at which conductive components in the PCBA 500 (e.g., the signal/foil layer 510, 512) are situated. Each of the pre-preg layers 514, 516 can be approximately 27% of the thickness of the PCBA 500.

The PCBA 500 can include one or more plane/core layer 518. In some implementations, the plane/core layer 518 can include a substrate (e.g., a metal sheet) forming the core of the PCBA 500. The plane/core layer 518 can be approximately 20% of the thickness of the PCBA 500.

Figure 6:
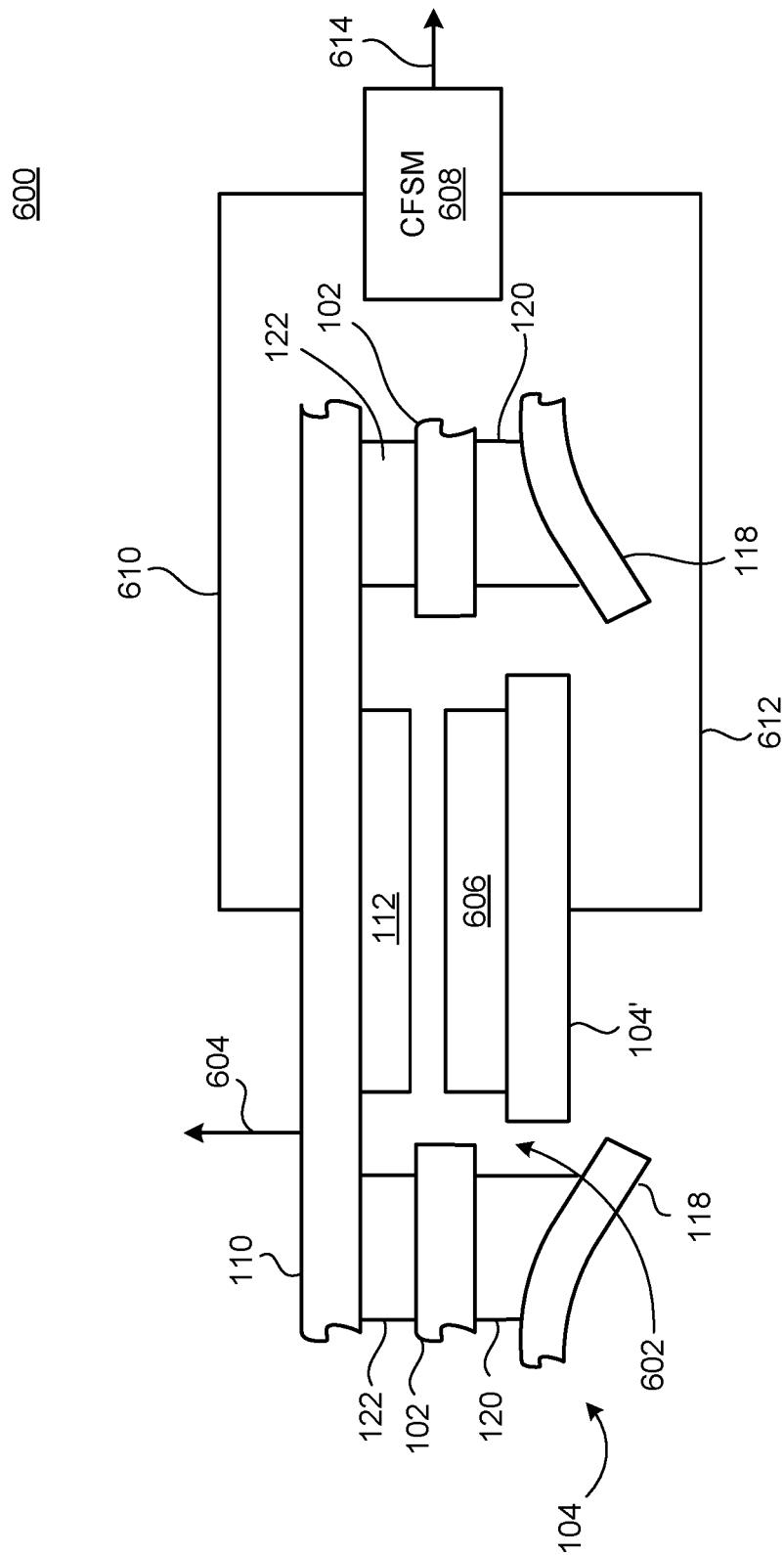
FIG. 6 shows an example of a trackpad architecture with on-PCBA capacitive force sensing.

FIG. 6 shows an example of a trackpad architecture 600 with on-PCBA capacitive force sensing. The trackpad architecture 600 can be implemented in any trackpad described herein, including, but not limited to, a trackpad using the trackpad architecture 100 in FIG. 1. Some aspects of the trackpad architecture 100 will be used for exemplification. The trackpad architecture 600 is truncated for simplicity. As such, in an implementation some features can extend further than shown in the illustration.

The trackpad architecture 600 includes the circuit board 110. For example, the circuit board 110 can be a PCBA.

The trackpad architecture 600 includes the stiffener plate 102 mounted to the circuit board 110 by adhesive 122. An opening 602 is formed in the stiffener plate 102.

The trackpad architecture 600 includes the discs 120 between the stiffener plate 102 and the target plate 104. The spring elements 118 of the target plate 104 are currently shown in a flexed state, whereas another portion 104' of the target plate 104 is not currently flexed (e.g., the portion 104' is not a spring element). The flexing can be due to a pressure applied to a substrate (not shown) which causes the circuit board 110 and the stiffener plate 102 to press against the discs 120, thereby partially compressing the discs 120. When the spring elements 118 are not flexed, the spring elements 118 may essentially align with the portion 104'.

In operation, the circuit board 110 can detect the position of an object (e.g., a finger or a stylus) relative to the trackpad and generate a position signal 604. The position signal 604 can be used for one or more purposes in a system having a trackpad with the trackpad architecture 600. For example, a cursor on a screen can be positioned corresponding to the detected position(s).

The trackpad architecture 600 can facilitate capacitive force sensing. A dielectric 606 can be placed between the portion 104' of the target plate 104 and the pad 112 on the circuit board 110. For example, the dielectric 606 can be mounted to the portion 104'. A capacitive force sensing module (CFSM) 608 in the trackpad architecture 600 can have a connection 610 to the pad 112, and a connection 612 to the portion 104' of the target plate 104. The CFSM 608 can be implemented using some or all exemplary components described with reference to FIG. 15. The CFSM 608 can detect a capacitance of the pad 112 and the target plate 104, and can generate a force signal 614. In some implementations, the force signal can represent detection of a force onto the substrate (not shown) causing displacement of the pad 112. For example, the force signal 614 can be used for triggering one or more operations in the system.

FIG. 7 shows an example of a trackpad architecture 700. The trackpad architecture 700 can be implemented in any trackpad described herein. Some aspects of the trackpad architecture 100 will be used for exemplification. For example, the trackpad architecture 700 includes the stiffener plate 102 and does not include the target plate 104 (FIG. 1).

A housing 702 is shown in FIG. 7. The housing 702 represents some or all of the structure in which the trackpad is implemented. Such a structure can be a mobile electronic device, a stationary electronic device and/or a display device, to name just a few examples. In some implementations, the trackpad is implemented on a laptop computer and the housing 702 can represent part of the structure of such a laptop computer. For example, the housing 702 can include a metal structure against which the trackpad architecture 700 is mounted.

Some or all of the housing 702 can serve as a plate for purposes of capacitive force sensing. This can conceptually be described as a target plate 704 being integral with the housing 702. In a sense, the target plate 704 represents that some or all of the housing 702 can be considered part of the trackpad architecture 700 and can serve as a target plate or ground plate for the trackpad architecture 700. As such, the target plate 104 (FIG. 1) need not be used as a separate component; rather, the target plate 704 integral to the housing 702 can be used for capacitive force sensing.

The housing 702 can be provided with spring elements 706. In this example, the spring elements 706 include spring fingers. In some implementations, the discs 120 can be positioned against the spring elements 706. The spring elements 706 can serve a function identical or similar to that of the spring elements 118 (FIG. 1). For example, the spring elements 706 can facilitate dislocation of the substrate 106, the circuit board 110 and the stiffener plate 102 with regard to the housing 702. The spring elements 706 can flex because a recess (not shown) is provided on the opposite side of the spring element 706 from the disc 120. In the laptop example, no laptop components (e.g., circuitry or other structures) are placed immediately behind the spring element 706 from the perspective of the disc 120. The spring element 706 can be formed in any suitable way. In some implementations, a cutout 708 can be formed in the housing 702 so as to form the spring element 706. For example, the cutout 708 can be machined into the housing 702.

FIG. 8 shows an example of a trackpad architecture 800. The trackpad architecture 800 can be implemented in any trackpad described herein. Some aspects of the trackpad architecture 100 will be used for exemplification. For example, the trackpad architecture 800 includes the target plate 104 and does not include the stiffener plate 102 (FIG. 1).

The trackpad architecture 100 includes a substrate 806 with a surface 806' that can be intended to be facing toward a user. For example, the surface 806' can be accessible to the user, such as by way of the user's finger(s) and/or a stylus or other object. The substrate 806 has a thickness that is dimensioned to provide adequate stiffness for the circuit board 110 without any other separate component providing added stiffness. For example, the substrate 806 can be thicker than the substrate 106 (FIG. 1). The dielectric 126 can be included in the trackpad architecture 800 and can be mounted to the circuit board 110 using the adhesive 132. The discs 120 can be included in the trackpad architecture 800 and can be positioned between the circuit board 110 and the target plate 104. As such, the discs 120 can facilitate movement of the substrate 806 and the circuit board 110 relative to the target plate 104.

Figure 9:
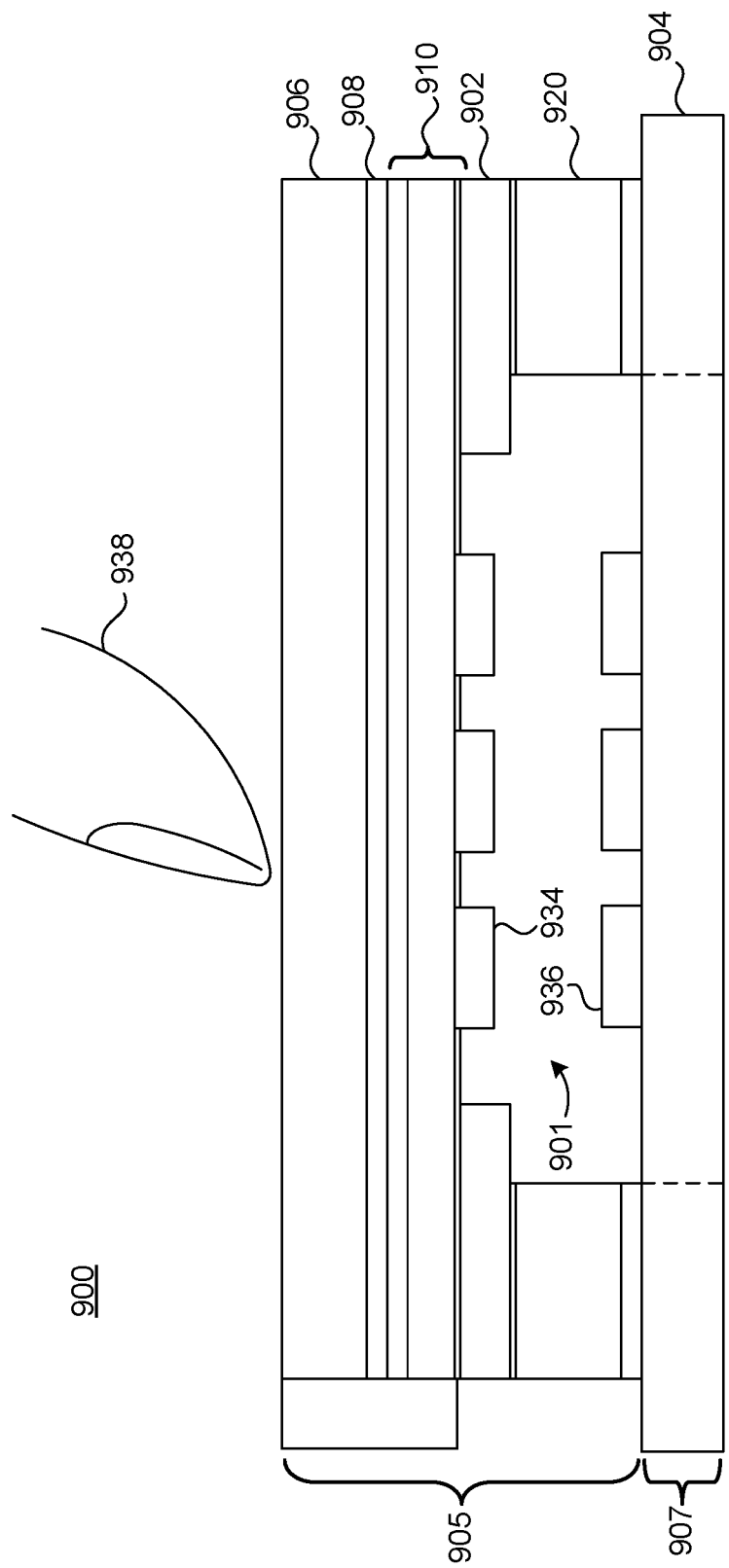
FIG. 9 shows an example of a trackpad architecture in which a haptic feedback component is split between a moving part and a static part of the trackpad.

FIG. 9 shows an example of a trackpad architecture 900 in which a haptic feedback component 901 is split between a moving part 905 and a static part 907 of the trackpad. The trackpad architecture 900 can include a substrate 906 that can serve a function identical or similar to that of the substrate 106 (FIG. 1) and/or the substrate 806 (FIG. 8). For example, the substrate 906 can include a glass overlay. The trackpad architecture 900 can include an adhesive 908 that can serve a function identical or similar to that of the adhesive layer 108 (FIG. 1). For example, the adhesive 908 can include a pressure-sensitive adhesive. The trackpad architecture 900 can include a circuit board 910 that can serve a function identical or similar to that of the circuit board 110 (FIG. 1). For example, the circuit board 910 can include a PCBA. The trackpad architecture 900 can include a stiffener plate 902 that can serve a function identical or similar to that of the stiffener plate 102 (FIG. 1). The trackpad architecture 900 can include a disc 920 that can serve a function identical or similar to that of the disc 120 (FIG. 1). For example, the disc 920 can include a gel material. The trackpad architecture 900 can include a plate 904 that can serve a function identical or similar to that of the target plate 104 (FIG. 1) and/or to that of the target plate 704 in the housing 702 (FIG. 7). Some components of the trackpad architecture 900 can be attached to each other in any suitable way, including, but not limited to, by adhesives.

The haptic feedback component 901 includes a moving component 934 and a static component 936. The term "moving" indicates that the moving component 934 is positioned at the moving part 905; the term "static" indicates that the static component 936 is positioned on the static part 907. Interaction between the moving component 934 and the static component 936 can provide haptic feedback perceptible to a user through a finger 938. In some implementations, the moving component 934 includes one or more coils (e.g., air core coils) and the static component 936 includes one or more magnets (e.g., permanent magnets). For example, the coils can be assembled to the circuit board 910. In some implementations, the moving component 934 includes one or more magnets and the static component 936 includes one or more coils.

The haptic feedback component 901 can be considered as having removed the moving mass from a linear resonant actuator and made the moving part 905 into the moving mass. The coils can be arranged in a way that provides magnetic force primarily or predominantly to the moving part 905. The magnets can be arranged in a way that provides magnetic force primarily or predominantly to the moving part 905. In some implementations, the magnets can be arranged according to a rotating pattern of magnetization. For example, the magnets can be arranged in a Halbach array.

If the user (e.g., the finger 938) presses on the substrate 906 with more force, the separation between the magnet(s) and the coil(s) can decrease. In some implementations, this can increase the magnetic force being applied to the moving part 905. More magnetic force being applied can cause the haptic feedback to be stronger. This can be advantageous when haptic feedback is provided in response to such user-applied force (e.g., in response to the user clicking on the substrate 906). For example, the stronger the user presses, the stronger the effect of the haptic feedback can be.

Figure 10:
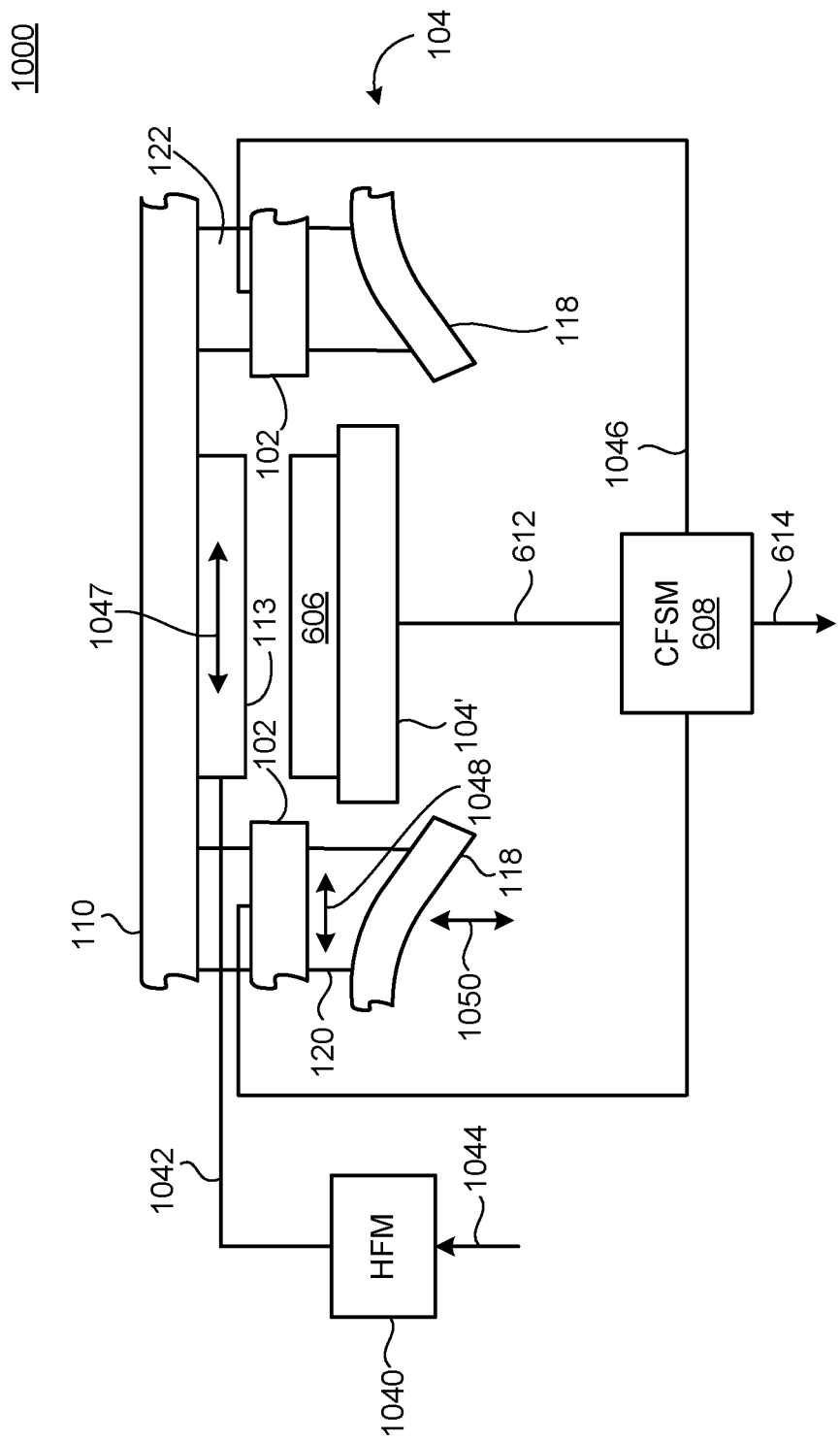
FIG. 10 shows an example of a trackpad architecture illustrating decoupling of force-sensing elements from elements that provide haptic feedback.

FIG. 10 shows an example of a trackpad architecture 1000 illustrating decoupling of force-sensing elements from elements that provide haptic feedback. The trackpad architecture 1000 can be implemented in any trackpad described herein. Some aspects of the trackpad architecture 600 will be used for exemplification. For example, the trackpad architecture 1000 includes the stiffener plate 102 and does not include the pad 112 (FIG. 1). The trackpad architecture 1000 can have the haptic feedback component 113 mounted to the circuit board 110.

A haptic feedback module (HFM) 1040 can be included in the trackpad architecture 1000 and can have a connection 1042 to the haptic feedback component 113. The HFM 1040 can be implemented using some or all exemplary components described with reference to FIG. 15. The CFSM 608 can have the connection 612 to the portion 104' of the target plate 104. The CFSM 608 can have a connection 1046 to the stiffener plate 102. The CFSM 608 can detect a capacitance of the stiffener plate 102 and the target plate 104, and can generate the force signal 614.

The HFM 1040 can receive a feedback signal 1044 (e.g., from the system) and can trigger the haptic feedback component 113 to provide haptic feedback 1047 (here conceptually illustrated using an arrow). The disc 120 can facilitate the haptic feedback 1047 by undergoing a distortion 1048 (here conceptually illustrated using an arrow). For example, the distortion 1048 can involve a compression, stretching, shearing and/or skewing of the disc 120.

A user applying pressure to a substrate (not shown) coupled to the circuit board 110 can cause a movement 1050 of the circuit board 110 and the stiffener plate 102 as facilitated by the spring element 118. The movement 1050 is here conceptually illustrated using an arrow. For example, the disc 120 facilitates the haptic feedback 1047 by undergoing the distortion 1048, and causes the spring element 118 to facilitate the movement 1050. The trackpad architecture 1000 therefore features decoupling of force-sensing elements from elements that provide haptic feedback.

Figure 11:
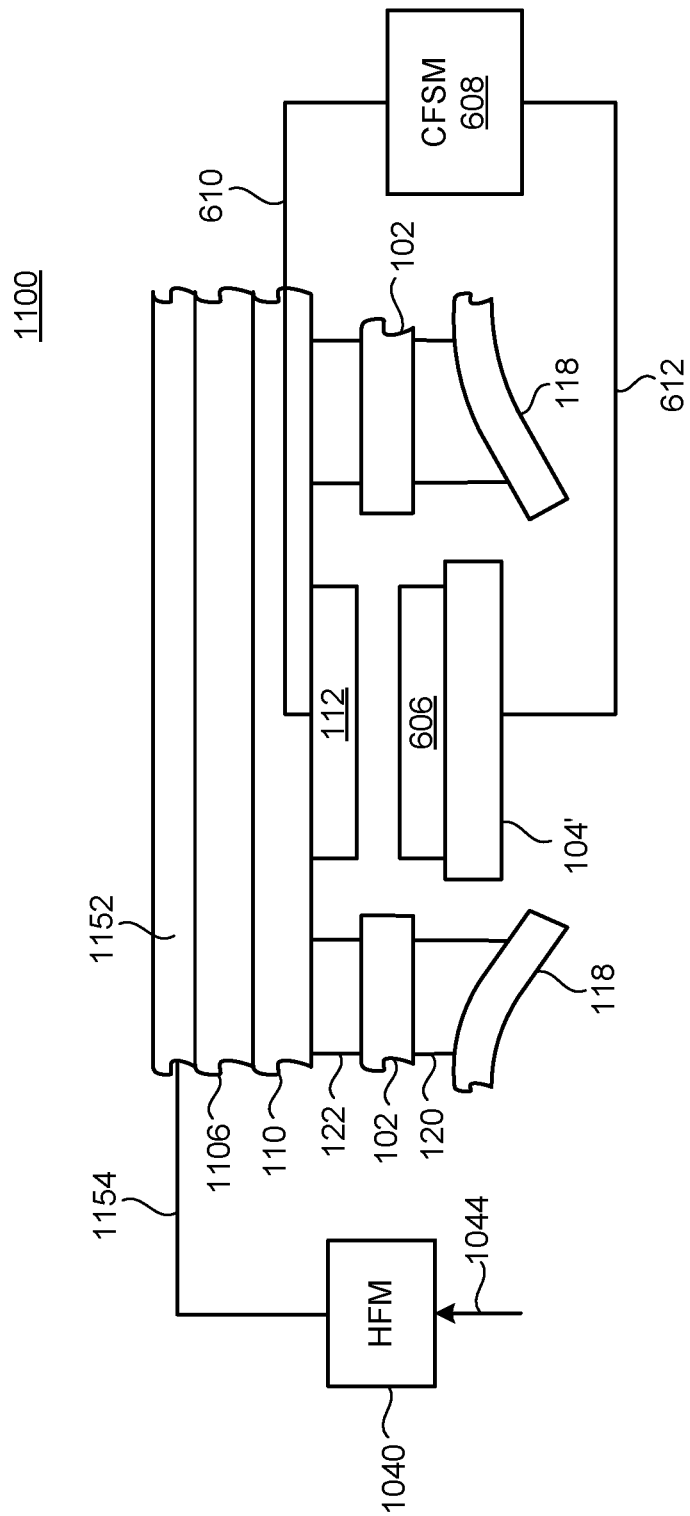
FIG. 11 shows an example of a trackpad architecture that provides haptic feedback using a layer.

FIG. 11 shows an example of a trackpad architecture 1100 that provides haptic feedback using a layer 1152. The trackpad architecture 1100 can be implemented in any trackpad described herein. Some aspects of the trackpad architectures 600 and 1000 will be used for exemplification. The trackpad architecture 1100 can include a substrate 1106 that can serve a function identical or similar to that of the substrate 106 (FIG. 1) and/or the substrate 806 (FIG. 8). The layer 1152 can be coupled to the substrate 1106.

The layer 1152 can provide haptic feedback to a user by way of the HFM 1040 and a connection 1154. In some implementations, the layer 1152 includes a piezoelectric actuator controlled by the HFM 1040. For example, the layer 1152 can include one or more ceramic components capable of providing actuation. For example, the layer 1152 can include one or more films capable of providing actuation.

Figure 12:
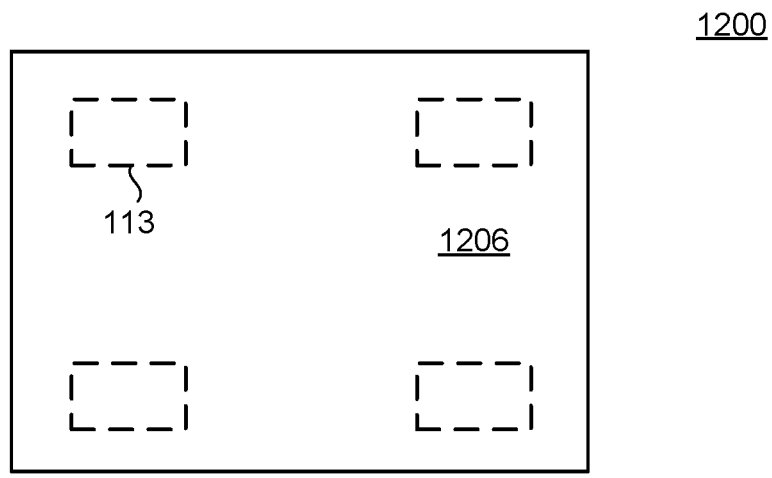
FIG. 12 shows an example of a trackpad that can provide localized haptic feedback.

FIG. 12 shows an example of a trackpad 1200 that can provide localized haptic feedback. The trackpad 1200 can include a substrate 1206 that can serve a function identical or similar to that of the substrate 106 (FIG. 1), the substrate 806 (FIG. 8) and/or the substrate 1106 (FIG. 11). The trackpad 1200 can include multiple haptic feedback components 113, here shown in phantom. In some implementations, the haptic feedback components 113 can be controlled by a haptic feedback module (not shown) in the trackpad 1200, the haptic feedback module serving a function identical or similar to that of the HFM 1040 (FIG. 10). For example, the haptic feedback components 113 can be coupled to a circuit board (not shown) in the trackpad 1200. In some implementations, the haptic feedback components 113 can be arranged in any of multiple patterns relative to the substrate 1206. For example, the haptic feedback components 113 are here arranged in a rectangular pattern. One, or multiple, or all of the haptic feedback components 113 can be actuated to provide haptic feedback. Accordingly, the trackpad 1200 is an example of a trackpad that can provide localized haptic feedback.

Figure 13:
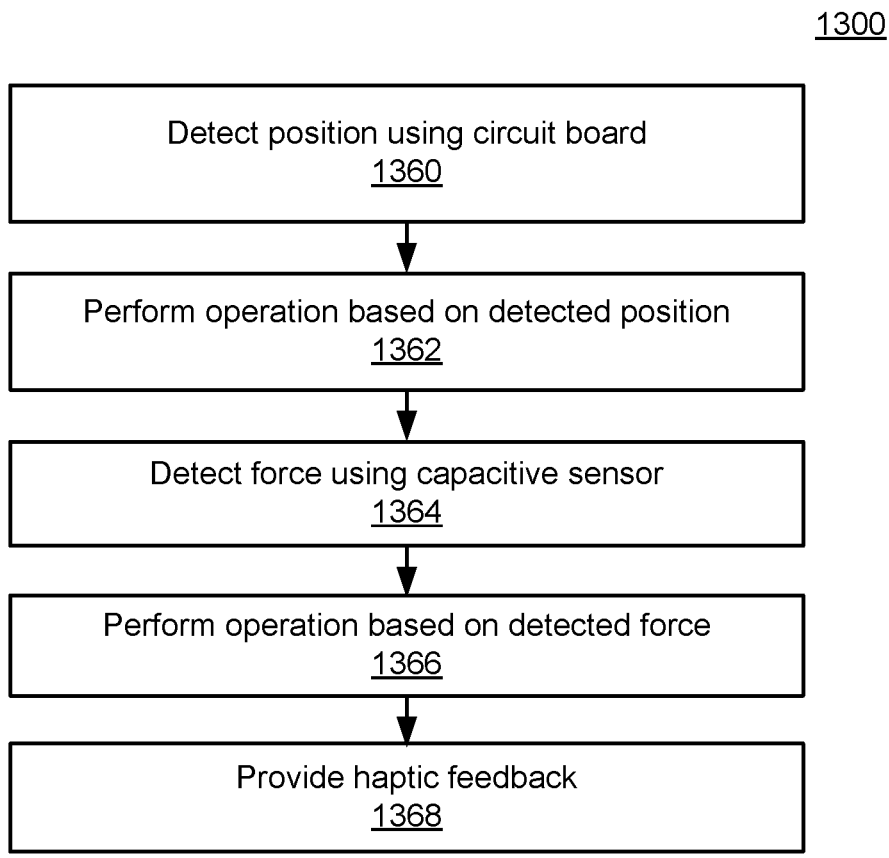
FIG. 13 shows an example of a method.

FIG. 13 shows an example of a method 1300. The method 1300 can be performed with regard to any trackpad described herein. For example, the method 1300 can be performed using any example of trackpad architecture described herein and one or more device described with reference to FIG. 15. More or fewer operations than shown can be performed. Two or more operations can be performed in a different order.

At 1360, a position can be detected using a circuit board. For example, the circuit board 110 (FIG. 1) can detect the position of the finger 938 (FIG. 9) and generate position signal 604 (FIG. 6).

At 1362, at least one operation can be performed based on the detected position. For example, an object presented on a screen of a display device can be selected, moved, acted upon or de-selected based on the detected position.

At 1364, a force can be detected using a capacitive sensor. For example, a click performed on the substrate 106 (FIG. 1) performed by the finger 938 (FIG. 9) can be detected using the CFSM 608 (FIG. 6), and the force signal 614 (FIG. 6) can be generated.

At 1366, at least one operation can be performed based on the detected force. For example, an object presented on a screen of a display device can be selected, moved, acted upon or de-selected based on the detected position.

At 1368, haptic feedback can be provided. In some implementations, the HFM 1040 (FIG. 10) can provide haptic feedback using the haptic feedback component 113 (FIG. 1) and/or the layer 1152 (FIG. 11). For example, the haptic feedback 1047 (FIG. 10) can be provided.

Figure 14A:
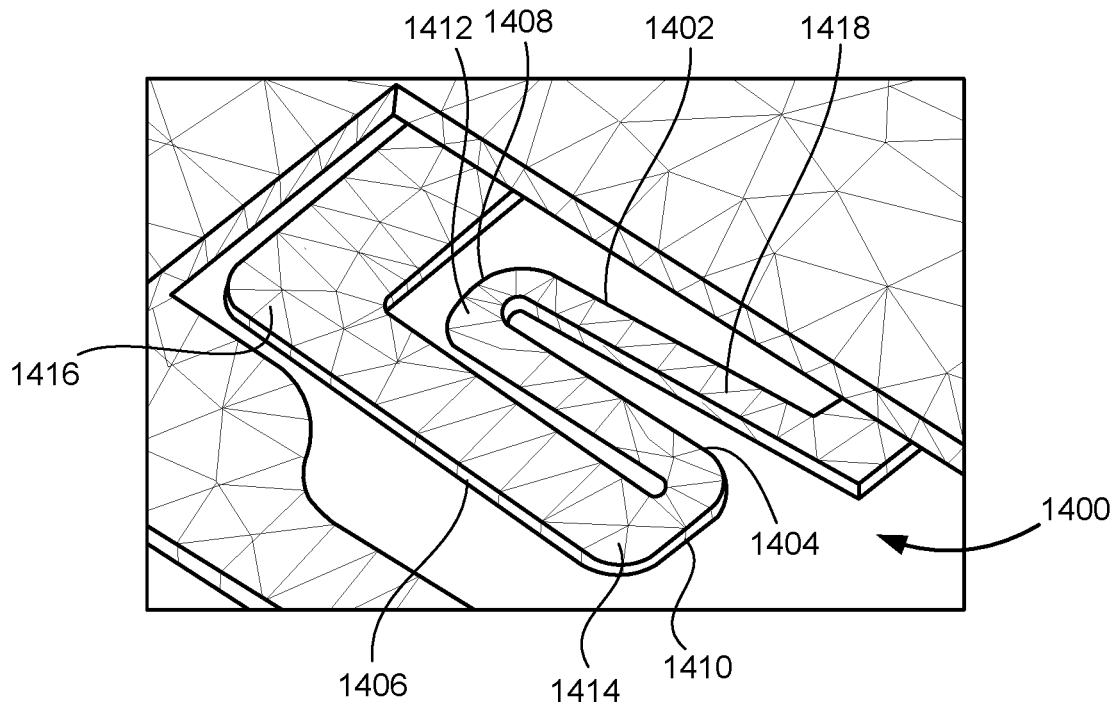
FIGS. 14A-D show examples of spring elements.

FIGS. 14A-D show examples of spring elements. In FIG. 14A, a spring element 1400 includes respective legs 1402, 1404 and 1406. The legs 1402 and 1404 are connected to each other by way of a turn 1408, and the legs 1404 and 1406 are connected to each other by way of a turn 1410. The legs 1402, 1404 and 1406 are here essentially parallel to each other. For example, the turns 1408 and/or 1410 can provide essentially a 180 degree turn. The legs 1402, 1404 and 1406 can have the same, or different, widths as each other. In some implementations, the legs 1402 and 1404 have about the same width. In some implementations, the leg 1406 can have about twice the width as the leg 1402 and/or 1404. The leg 1402 can have an essentially perpendicular connection to a plate (e.g., to a target plate). The leg 1406 can have an essentially perpendicular connection to a plate (e.g., to a target plate). The spring element 1400 can have essentially a common thickness or can have two or more thicknesses.

Deformation can vary in different portions of the spring element 1400. For example, this can be explored using finite element analysis. In the spring element 1400, portions 1412 and/or 1414 can undergo the most deformation (e.g., when a load is placed at a substrate that subjects the spring element 1400 to force, such as through one or more discs abutting the spring element 1400). Portion 1416 and/or 1418 can undergo the least deformation.

Figure 14B:
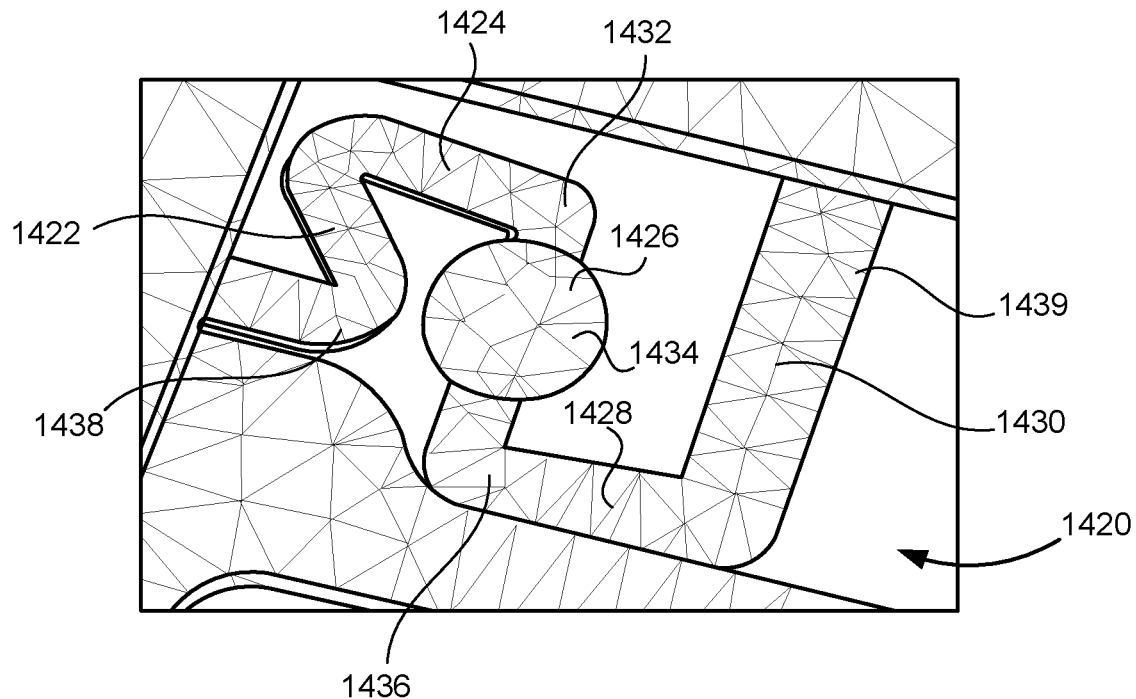

In FIG. 14B, a spring element 1420 includes leg 1422, leg 1424, a portion 1426, leg 1428 and a leg 1430. Legs 1422 and 1424 can be connected to each other at an angle. The leg 1424 and the portion 1426 can be essentially perpendicular to each other. The portion 1426 and the leg 1428 can be connected essentially perpendicular to each other. The leg 1428 and the leg 1430 can be essentially perpendicular to each other. The legs 1422, 1424, 1428 and 1430 can have the same, or different, widths as each other. Here, the legs 1422 and 1424 have about the same width. Here, the leg 1428 is wider than the legs 1422 and 1424. The leg 1430 can have about twice the width of the leg 1422 and/or 1424. The leg 1422 can have an angled connection to a plate (e.g., a target plate). The leg 1430 can have an essentially perpendicular connection to a plate (e.g., a target plate). The portion 1426 can have a different shape than the leg 1422, 1424, 1428 and/or 1430. In some implementations, the portion 1426 includes one or more rounded shapes. For example, the portion 1426 can include an essentially circular portion. The spring element 1420 can have essentially a common thickness or can have two or more thicknesses.

Deformation can vary in different portions of the spring element 1420. For example, this can be explored using finite element analysis. In the spring element 1420, portions 1432, 1434 and/or 1436 can undergo the most deformation (e.g., when a load is placed at a substrate that subjects the spring element 1420 to force, such as through one or more discs abutting the spring element 1420). Portion 1438 and/or 1439 can undergo the least deformation.

Figure 14C:
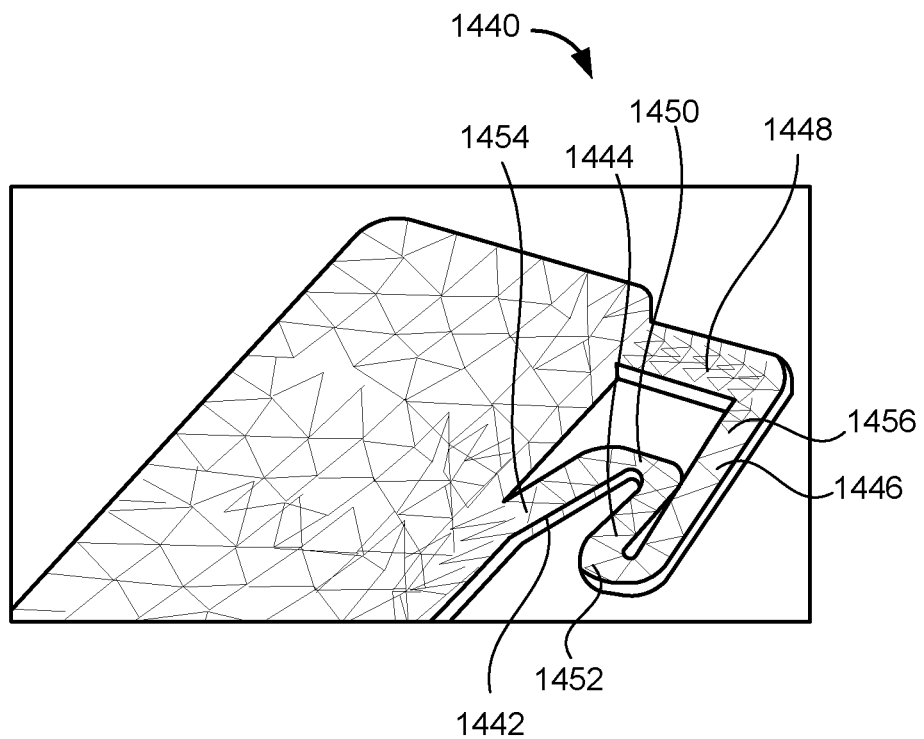

In FIG. 14C, a spring element 1440 includes leg 1442, leg 1444, a leg 1446 and a leg 1448. Legs 1442, 1444 and 1446 can be essentially parallel to each other. The leg 1448 can be connected essentially perpendicular to one or more of the legs 1442, 1444 and 1446. The legs 1442, 1444, 1446 and 1448 can have the same, or different, widths as each other. Here, the legs 1442, 1444 and 1446 have about the same width. The leg 1448 can have about twice the width of the leg 1442, 1444 and/or 1446. The leg 1442 can have an essentially linear (straight) connection to a plate (e.g., a target plate). The leg 1448 can have an essentially perpendicular connection to a plate (e.g., a target plate). The spring element 1440 can have essentially a common thickness or can have two or more thicknesses.

Deformation can vary in different portions of the spring element 1440. For example, this can be explored using finite element analysis. In the spring element 1440, portion 1450 and/or 1452 can undergo the most deformation (e.g., when a load is placed at a substrate that subjects the spring element 1440 to force, such as through one or more discs abutting the spring element 1440). Portion 1454 and/or 1456 can undergo the least deformation.

Figure 14D:
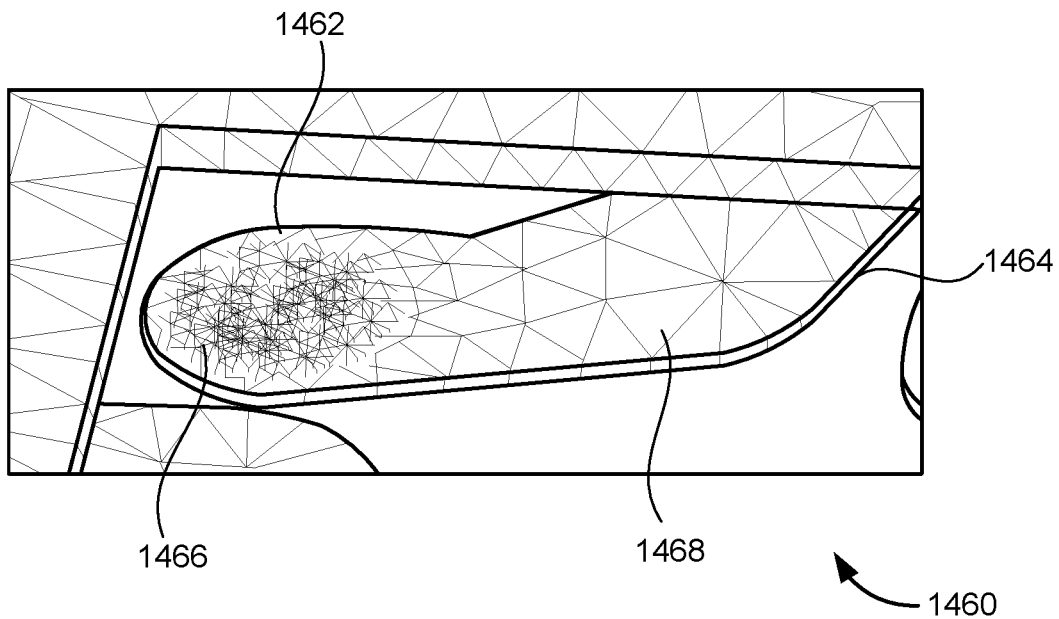

In FIG. 14D, a spring element 1460 includes leg 1462 and leg 1464. Legs 1462 and 1464 can be connected to each other at an angle. The legs 1462 and 1464 can have the same, or different, widths as each other. Here, the legs 1462 and 1464 have about the same width. The leg 1464 can have an angled connection to a plate (e.g., a target plate). The spring element 1460 can have essentially a common thickness, or can have two or more thicknesses.

Deformation can vary in different portions of the spring element 1460. For example, portion 1466 can undergo the most deformation (e.g., when a load is placed at a substrate that subjects the spring element 1460 to force, such as through one or more discs abutting the spring element 1460). Portion 1468 can undergo the least deformation.

Figure 15:
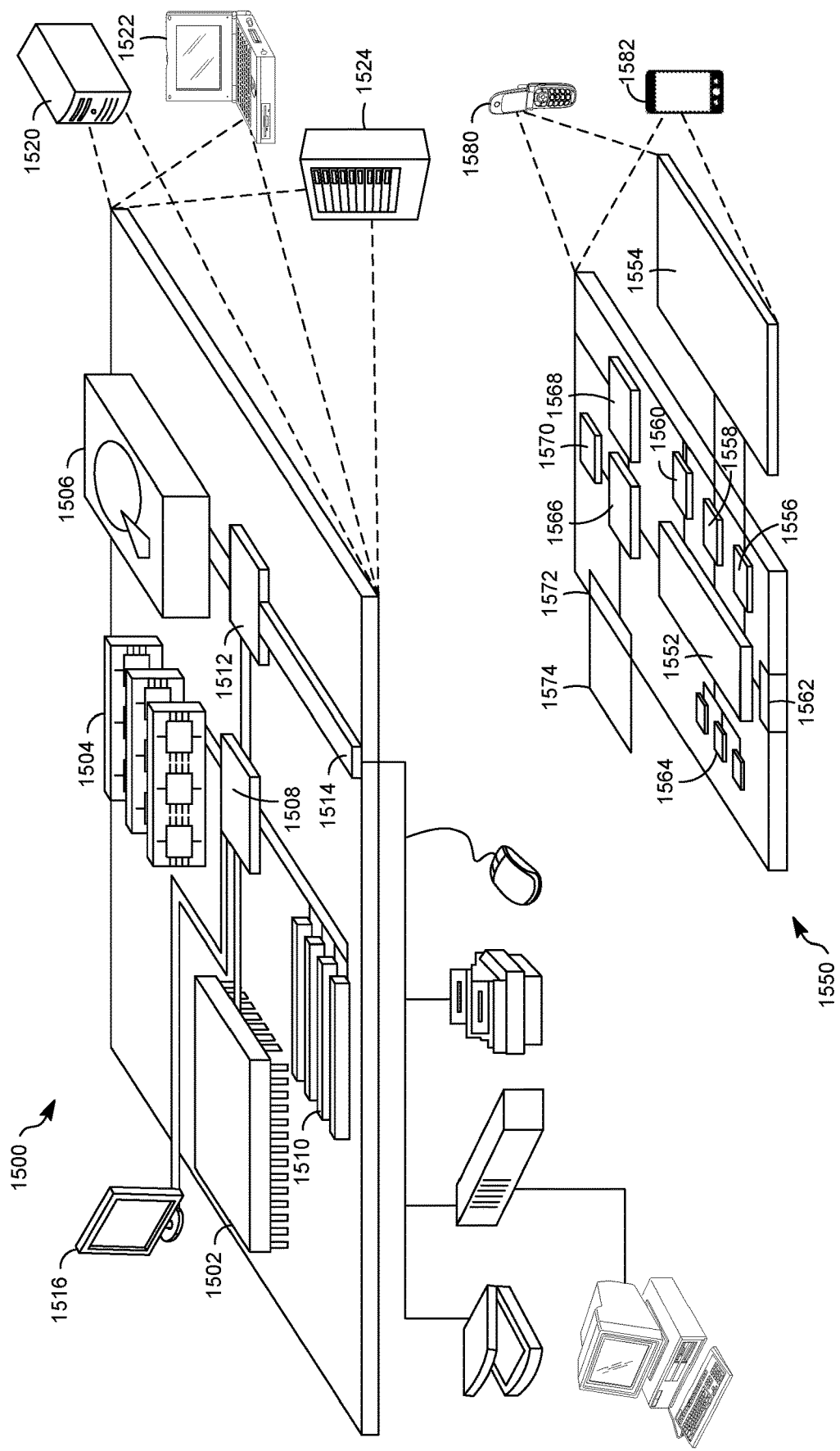
FIG. 15 shows an example of a computer device and a mobile computer device that can be used to implement the techniques described here.

FIG. 15 shows an example of a generic computer device 1500 and a generic mobile computer device 1550, which may be used with the techniques described here. Computing device 1500 is intended to represent various forms of digital computers, such as laptops, desktops, tablets, workstations, personal digital assistants, televisions, servers, blade servers, mainframes, and other appropriate computing devices. Computing device 1550 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 1500 includes a processor 1502, memory 1504, a storage device 1506, a high-speed interface 1508 connecting to memory 1504 and high-speed expansion ports 1510, and a low speed interface 1512 connecting to low speed bus 1514 and storage device 1506. The processor 1502 can be a semiconductor-based processor. The memory 1504 can be a semiconductor-based memory. Each of the components 1502, 1504, 1506, 1508, 1510, and 1512, are interconnected using various busses, and may be mounted on a common motherboard or in other manners as appropriate. The processor 1502 can process instructions for execution within the computing device 1500, including instructions stored in the memory 1504 or on the storage device 1506 to display graphical information for a GUI on an external input/output device, such as display 1516 coupled to high speed interface 1508. In other implementations, multiple processors and/or multiple buses may be used, as appropriate, along with multiple memories and types of memory. Also, multiple computing devices 1500 may be connected, with each device providing portions of the necessary operations (e.g., as a server bank, a group of blade servers, or a multi-processor system).

The memory 1504 stores information within the computing device 1500. In one implementation, the memory 1504 is a volatile memory unit or units. In another implementation, the memory 1504 is a non-volatile memory unit or units. The memory 1504 may also be another form of computer-readable medium, such as a magnetic or optical disk.

The storage device 1506 is capable of providing mass storage for the computing device 1500. In one implementation, the storage device 1506 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 1504, the storage device 1506, or memory on processor 1502.

The high-speed controller 1508 manages bandwidth-intensive operations for the computing device 1500, while the low speed controller 1512 manages lower bandwidth-intensive operations. Such allocation of functions is exemplary only. In one implementation, the high-speed controller 1508 is coupled to memory 1504, display 1516 (e.g., through a graphics processor or accelerator), and to high-speed expansion ports 1510, which may accept various expansion cards (not shown). In the implementation, low-speed controller 1512 is coupled to storage device 1506 and low-speed expansion port 1514. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 1500 may be implemented in a number of different forms, as shown in the figure. For example, it may be implemented as a standard server 1520, or multiple times in a group of such servers. It may also be implemented as part of a rack server system 1524. In addition, it may be implemented in a personal computer such as a laptop computer 1522. Alternatively, components from computing device 1500 may be combined with other components in a mobile device (not shown), such as device 1550. Each of such devices may contain one or more of computing device 1500, 1550, and an entire system may be made up of multiple computing devices 1500, 1550 communicating with each other.

Computing device 1550 includes a processor 1552, memory 1564, an input/output device such as a display 1554, a communication interface 1566, and a transceiver 1568, among other components. The device 1550 may also be provided with a storage device, such as a microdrive or other device, to provide additional storage. Each of the components 1550, 1552, 1564, 1554, 1566, and 1568, are interconnected using various buses, and several of the components may be mounted on a common motherboard or in other manners as appropriate.

The processor 1552 can execute instructions within the computing device 1550, including instructions stored in the memory 1564. The processor may be implemented as a chipset of chips that include separate and multiple analog and digital processors. The processor may provide, for example, for coordination of the other components of the device 1550, such as control of user interfaces, applications run by device 1550, and wireless communication by device 1550.

Processor 1552 may communicate with a user through control interface 1558 and display interface 1556 coupled to a display 1554. The display 1554 may be, for example, a TFT LCD (Thin-Film-Transistor Liquid Crystal Display) or an OLED (Organic Light Emitting Diode) display, or other appropriate display technology. The display interface 1556 may comprise appropriate circuitry for driving the display 1554 to present graphical and other information to a user. The control interface 1558 may receive commands from a user and convert them for submission to the processor 1552. In addition, an external interface 1562 may be provided in communication with processor 1552, so as to enable near area communication of device 1550 with other devices. External interface 1562 may provide, for example, for wired communication in some implementations, or for wireless communication in other implementations, and multiple interfaces may also be used.

The memory 1564 stores information within the computing device 1550. The memory 1564 can be implemented as one or more of a computer-readable medium or media, a volatile memory unit or units, or a non-volatile memory unit or units. Expansion memory 1574 may also be provided and connected to device 1550 through expansion interface 1572, which may include, for example, a SIMM (Single In Line Memory Module) card interface. Such expansion memory 1574 may provide extra storage space for device 1550, or may also store applications or other information for device 1550. Specifically, expansion memory 1574 may include instructions to carry out or supplement the processes described above, and may include secure information also. Thus, for example, expansion memory 1574 may be provided as a security module for device 1550, and may be programmed with instructions that permit secure use of device 1550. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 1564, expansion memory 1574, or memory on processor 1552, that may be received, for example, over transceiver 1568 or external interface 1562.

Device 1550 may communicate wirelessly through communication interface 1566, which may include digital signal processing circuitry where necessary. Communication interface 1566 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 1568. In addition, short-range communication may occur, such as using a Bluetooth, WiFi, or other such transceiver (not shown). In addition, GPS (Global Positioning System) receiver module 1570 may provide additional navigation- and location-related wireless data to device 1550, which may be used as appropriate by applications running on device 1550.

Device 1550 may also communicate audibly using audio codec 1560, which may receive spoken information from a user and convert it to usable digital information. Audio codec 1560 may likewise generate audible sound for a user, such as through a speaker, e.g., in a handset of device 1550. Such sound may include sound from voice telephone calls, may include recorded sound (e.g., voice messages, music files, etc.) and may also include sound generated by applications operating on device 1550.

The computing device 1550 may be implemented in a number of different forms, as shown in the figure. For example, it may be implemented as a cellular telephone 1580. It may also be implemented as part of a smart phone 1582, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the invention.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A trackpad comprising:
   a substrate;
   a circuit board coupled to the substrate for detecting a position of an object adjacent the substrate;
   a haptic feedback component coupled to the circuit board;
   a first plate coupled to the circuit board;
   a second plate including a spring element, a spacer coupling the circuit board and the spring element to each other; and
   a capacitive force sensor that detects a capacitance between the first plate and the second plate, wherein the spring element and the spacer provide decoupling of the haptic feedback component and the capacitive force sensor from each other.

2. The trackpad of claim 1, wherein the spacer includes a stiffener plate positioned between the circuit board and the second plate, the stiffener plate having a recess, the recess aligned with the first plate.

3. The trackpad of claim 2, wherein the spacer further comprises an adhesive that attaches the stiffener plate and the circuit board to each other, and a disc that couples the stiffener plate and the second plate to each other.

4. The trackpad of claim 1, wherein the circuit board comprises a printed circuit board assembly, the printed circuit board assembly comprising a first solder mask layer, a core layer, and a first signal layer between the first solder mask layer and the core layer.

5. The trackpad of claim 4, wherein the first solder mask layer is assembled to the substrate, the printed circuit board assembly further comprising a second solder mask layer, and a second signal layer between the second solder mask layer and the core layer, the first and second signal layers being on opposite sides of the core layer from each other.

6. The trackpad of claim 5, further comprising a first pre-preg layer between the core layer and the first signal layer, and a second pre-preg layer between the core layer and the second signal layer.

7. The trackpad of claim 1, wherein the second plate is part of a housing accommodating the trackpad.

8. The trackpad of claim 7, wherein the spring element has a U-shape, the U-shape defined by a cutout in the housing.

9. The trackpad of claim 1, wherein the trackpad comprises a moving part and a static part, and wherein the haptic feedback component includes a first component assembled to the moving part, and a second component assembled to the static part.

10. The trackpad of claim 1, wherein the first plate comprises a stiffener plate assembled to the circuit board.

11. The trackpad of claim 1, wherein the haptic feedback component includes a layer that forms a trackpad surface for the trackpad, the layer providing haptic feedback using piezoelectric actuation.

12. The trackpad of claim 1, wherein the trackpad includes multiple haptic feedback components that provide localized haptic feedback, the multiple haptic feedback components arranged in a rectangular pattern relative to the substrate.

13. The trackpad of claim 1, wherein the spring element comprises one or more legs.

14. The trackpad of claim 13, wherein the spring element comprises multiple legs, at least two of the multiple legs connected to each other by a turn.

15. The trackpad of claim 13, wherein the spring element comprises multiple legs, at least two of the multiple legs having different widths from each other.

16. The trackpad of claim 13, wherein at least one of the one or more legs has a perpendicular connection to the second plate.

17. The trackpad of claim 13, wherein at least one of the one or more legs has a linear connection to the second plate.

18. The trackpad of claim 13, wherein at least one of the one or more legs has an angled connection to the second plate.

19. The trackpad of claim 13, wherein at least one of the one or more legs comprises an essentially circular portion.

20. A method comprising:
    detecting a position of an object adjacent a substrate of a trackpad, the position detected using a circuit board coupled to the substrate, the trackpad including a first plate;
    performing a first operation based on detecting the position;
    detecting a force applied to the substrate using a capacitive force sensor that detects a capacitance between the first plate and a second plate of the trackpad, the second plate including a spring element, wherein a spacer couples the circuit board and the spring element to each other; and
    providing haptic feedback to the substrate based at least in part on detecting the force, the haptic feedback provided using a haptic feedback component coupled to the circuit board, wherein the spring element and the spacer provide decoupling of the haptic feedback component and the capacitive force sensor from each other.

* * * * *